United States Patent
Lai et al.

(10) Patent No.: US 11,239,071 B1
(45) Date of Patent: Feb. 1, 2022

(54) METHOD OF PROCESSING SEMICONDUCTOR DEVICE

(71) Applicant: NANYA TECHNOLOGY CORPORATION, New Taipei (TW)

(72) Inventors: Jen-I Lai, Taoyuan (TW); Chun-Heng Wu, Taoyuan (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 17/111,476

(22) Filed: Dec. 3, 2020

(51) Int. Cl.
*H01L 21/02* (2006.01)
*B08B 7/00* (2006.01)
*B08B 5/00* (2006.01)
*H01L 21/762* (2006.01)

(52) U.S. Cl.
CPC .......... *H01L 21/02101* (2013.01); *B08B 5/00* (2013.01); *B08B 7/0021* (2013.01); *H01L 21/0206* (2013.01); *H01L 21/76224* (2013.01)

(58) Field of Classification Search
CPC .......... H01L 21/02101; H01L 21/0206; H01L 21/76224; B08B 5/00; B08B 7/0021
See application file for complete search history.

(56) References Cited

U.S. PATENT DOCUMENTS

| | | | |
|---|---|---|---|
| 5,013,366 A * | 5/1991 | Jackson | C23G 5/00 134/1 |
| 2004/0033831 A1* | 2/2004 | Tarantino | G07F 17/3223 463/22 |
| 2004/0144399 A1* | 7/2004 | McDermott | C11D 7/261 134/1 |
| 2005/0183740 A1* | 8/2005 | Fulton | H01L 21/76814 134/3 |
| 2007/0169791 A1* | 7/2007 | Han | B08B 3/00 134/2 |
| 2007/0259766 A1* | 11/2007 | Jackson | B01D 11/0403 494/36 |

FOREIGN PATENT DOCUMENTS

CN 1741973 A 3/2006

* cited by examiner

*Primary Examiner* — Sharidan Carrillo
(74) *Attorney, Agent, or Firm* — CKC & Partners Co., LLC

(57) ABSTRACT

A method of processing a semiconductor device including following operation is provided. A substrate is provided. The substrate is then processed with a treating solution, in which the treating solution includes liquid carbon dioxide and an additive. The treating solution is then displaced by a supercritical fluid carbon dioxide. The substrate is then dried by transforming the supercritical fluid carbon dioxide to gaseous carbon dioxide.

18 Claims, 12 Drawing Sheets

METHOD OF PROCESSING SEMICONDUCTOR DEVICE

BACKGROUND

Field of Invention

The present invention relates to a method of processing semiconductor device. More particularly, the present invention relates to a method of processing semiconductor device having high aspect ratio structure.

Description of Related Art

In the cleaning of semiconductor devices, cleaning liquids are generally used to remove contaminants on surfaces of substrate. After cleaning process, the cleaning solution is removed from the substrate of the semiconductor device by drying process. However, capillary forces of the cleaning liquid often cause deformation of the semiconductor devices during the drying process, especially for the semiconductor devices having high aspect ratio structure. Accordingly, there is a demand for a novel method for solving the above problems.

SUMMARY

In accordance with an aspect of the present invention, a method of processing a semiconductor device is provided. The method includes providing a substrate. The substrate is then processed with a treating solution, in which the treating solution includes liquid carbon dioxide and an additive. The treating solution is then displaced by a supercritical fluid carbon dioxide. The substrate is then dried by transforming the supercritical fluid carbon dioxide to gaseous carbon dioxide.

According to some embodiments of the present invention, processing the substrate with the treating solution includes providing gaseous $C_xH_{2x+2}$ and oxygen to form gaseous carbon dioxide and water vapor, wherein x is 1-4. The additive is mixed with the gaseous carbon dioxide and water vapor. The gaseous carbon dioxide is transformed from gaseous state to liquid state to form the treating solution.

According to some embodiments of the present invention, the additive includes HF, HCl, or $H_2O_2$.

According to some embodiments of the present invention, the additive is HF having a concentration of about 0.01%-1% in the treating solution.

According to some embodiments of the present invention, the additive is HCl having a concentration of about 0.01%-0.1% in the treating solution.

According to some embodiments of the present invention, the additive is $H_2O_2$ having a concentration of about 0.1%-3% in the treating solution.

According to some embodiments of the present invention, processing the substrate includes flowing the treating solution over the substrate.

According to some embodiments of the present invention, processing the substrate and drying the substrate are performed in a same processing chamber.

According to some embodiments of the present invention, displacing the treating solution by the supercritical fluid carbon dioxide includes displacing the treating solution by an additional liquid carbon dioxide; and transforming the additional liquid carbon dioxide to supercritical fluid carbon dioxide.

According to some embodiments of the present invention, the method further includes recycling the gaseous carbon dioxide.

In accordance with another aspect of the present invention, a method of processing a semiconductor device is provided. The method includes providing a substrate. The substrate is then processed with a treating solution, in which the treating solution includes supercritical fluid carbon dioxide and an additive. The treating solution is displaced by an additional supercritical fluid carbon dioxide. The substrate is dried by transforming the supercritical fluid carbon dioxide to gaseous carbon dioxide.

According to some embodiments of the present invention, processing the substrate with the treating solution includes providing gaseous $C_xH_{2x+2}$ and oxygen to form gaseous carbon dioxide and water vapor, in which x is 1-4. The gaseous carbon dioxide is then transformed to supercritical fluid carbon dioxide. The additive is mixed with the supercritical fluid carbon dioxide to form the treating solution.

According to some embodiments of the present invention, the additive includes dilute HF (DHF) solution, HCl solution, $H_2O_2$ solution, or hydrophobic agent.

According to some embodiments of the present invention, the additive is dilute HF (DHF) solution having a concentration of about 0.01%-1% in the treating solution.

According to some embodiments of the present invention, the additive is HCl solution having a concentration of about 0.01%-0.1% in the treating solution.

According to some embodiments of the present invention, the additive is $H_2O_2$ solution having a concentration of about 0.1%-3% in the treating solution.

According to some embodiments of the present invention, the hydrophobic agent includes organic fluorine compound or organic silicon compound.

According to some embodiments of the present invention, processing the substrate includes flowing the treating solution over the substrate.

According to some embodiments of the present invention, processing the substrate and drying the substrate are performed in a same processing chamber.

According to some embodiments of the present invention, the method further includes recycling the gaseous carbon dioxide.

It is to be understood that both the foregoing general description and the following detailed description are by examples, and are intended to provide further explanation of the invention as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
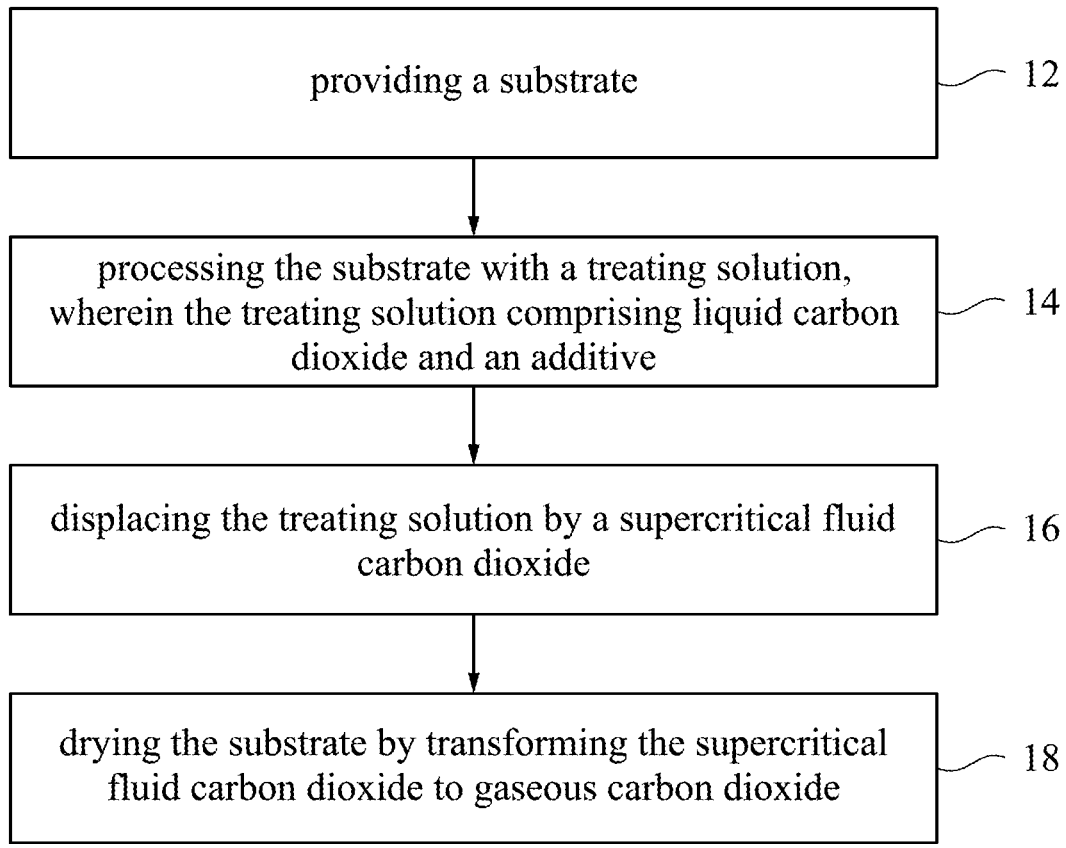
FIG. 1 is a flow chart illustrating a method of processing a semiconductor device in accordance with some embodiments of this disclosure.

Reference will now be made in detail to the present embodiments of the invention, examples of which are illustrated in the accompanying drawings. Wherever possible, the same reference numbers are used in the drawings and the description to refer to the same or like parts.

Specific embodiments of the components and arrangements described below are intended to simplify the present disclosure. Of course, these are merely embodiments and are not intended to limit the present disclosure. For example, forming a first feature above or on a second feature in the subsequent description may include an embodiment in which the first feature and the second feature are formed as in direct contact, or include an embodiment in which an additional feature is formed between the first feature and the second feature such that the first feature and the second feature are not in direct contact. Additionally, component symbols and/or letters may be repeated in various embodiments of the present disclosure. This repetition is for the purpose of simplicity and clarity, and does not in itself indicate the relationship between the various embodiments and/or configurations discussed.

Furthermore, spatial relative terms, such as "below", "under", "above", "over", etc., are intended to facilitate description of the relative relationship between a component or feature and another component or feature, as shown in the drawings. The true meaning of these spatial relative terms includes other orientations. For example, when the illustration is flipped up and down by 180 degrees, the relationship between a component and another component may change from "below" or "under" to "above" or "over". Furthermore, the spatial relative narratives used herein should be interpreted the same.

FIG. 1 is a flow chart illustrating a method of manufacturing a semiconductor device in accordance with some embodiments of this disclosure. As shown in FIG. 1, the method 10 includes operation 12, operation 14, operation 16 and operation 18. It is noted that the method depicted in FIG. 1 is merely an example, and is not intended to limit the present invention. Accordingly, additional operations may be performed before, during, and/or after the method depicted in FIG. 1, and some other operations may only be briefly described herein. FIG. 2 to FIG. 16 are cross-sectional views at various stages of method 10 according to some embodiments of the present disclosure.

Figure 2:
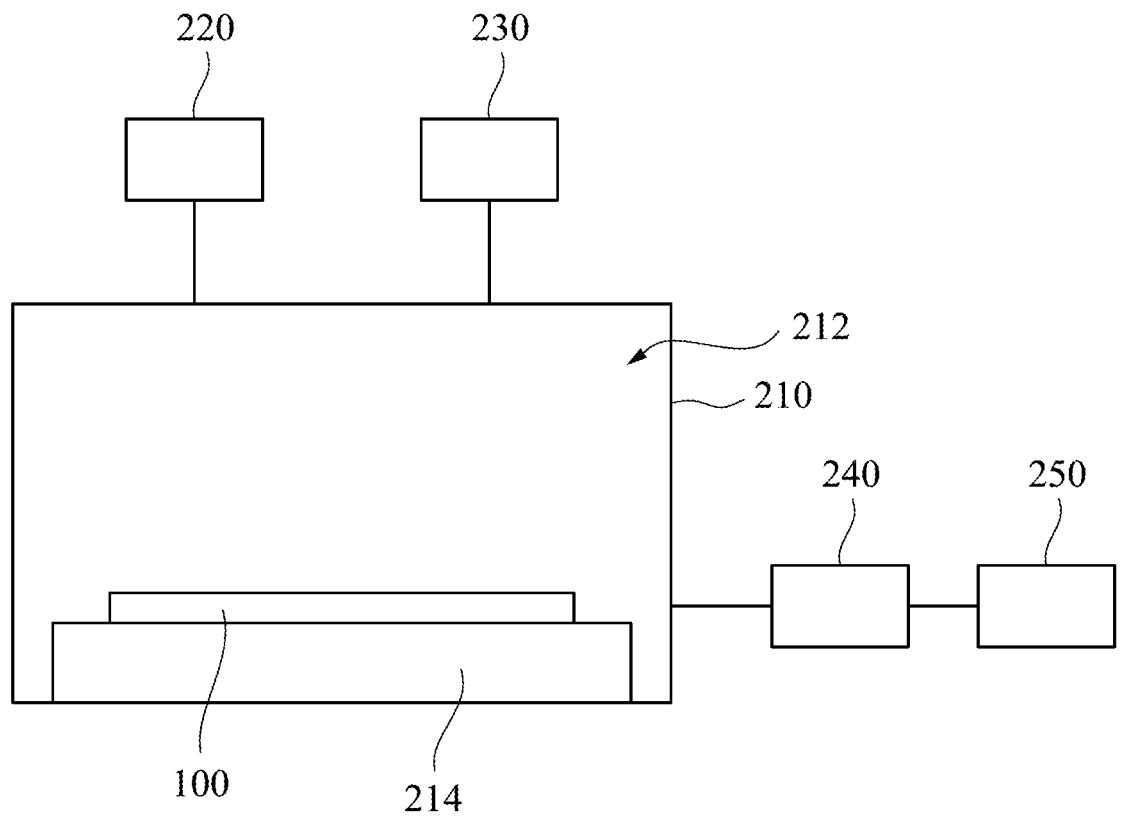
FIG. 2 is a cross-sectional view of a processing apparatus in accordance with some embodiments of this disclosure.

Reference is made to FIG. 1 and FIG. 2. In the operation 12 of FIG. 1, a substrate 100 is provided. The substrate 100 is placed in a processing apparatus 200. The processing apparatus 200 includes a container 210, a treating solution source 220, a fluid source 230 and an exhaust unit 240. As shown in FIG. 2, the container 210 includes a processing chamber 212 and a substrate support 214 for holding the substrate 100. The treating solution source 220 and the fluid source 230 are connected to the processing chamber 212 for introducing a treating solution and liquid into the processing chamber 212, respectively. The exhaust unit 240 is used for removing liquid and/or gas from the processing chamber 212.

Figure 3:
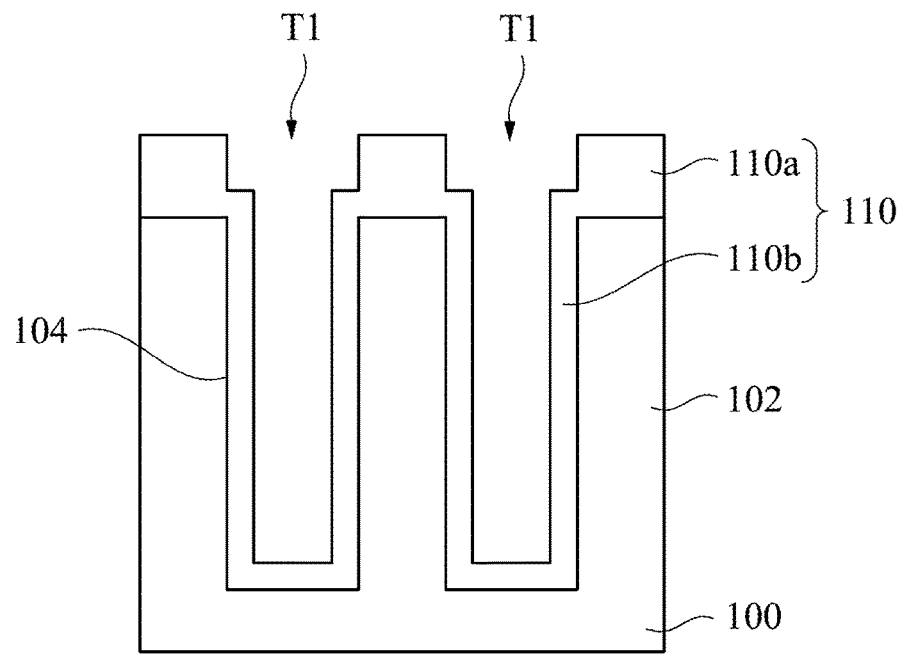
FIG. 3 to FIG. 16 are cross-sectional views of various intermediary stages in the processing of semiconductor device in accordance with some embodiments of this disclosure.

FIG. 3 is an enlarged diagram of the substrate 100 in FIG. 2. As shown in FIG. 3, the substrate 100 may have a plurality of trench T1 and a plurality of protruding portions 102 separated by the trenches T1. An oxide layer 110 may be formed on the substrate 100. Specifically, the oxide layer 110 may include a first portion 110a on the protruding portions 102 of the substrate 100 and a second portion 110b on an inner surface 104 of the substrate 100. In some embodiments, the substrate 110 may be, for example, a silicon substrate, a gallium arsenide substrate, a silicon germanium substrate, or the like. In some embodiments of the present invention, the substrate 110 may be a silicon substrate on insulator (SOI) substrate. In some embodiments, the substrate 110 may further include at least one shallow trench isolation (STI) region formed therein. In one example, the shallow trench isolation (STI) region may include silicon oxide, silicon nitride and/or silicon oxynitride. In some embodiments, the oxide layer 110 includes silicon oxide, but is not limited thereto.

Figure 4:
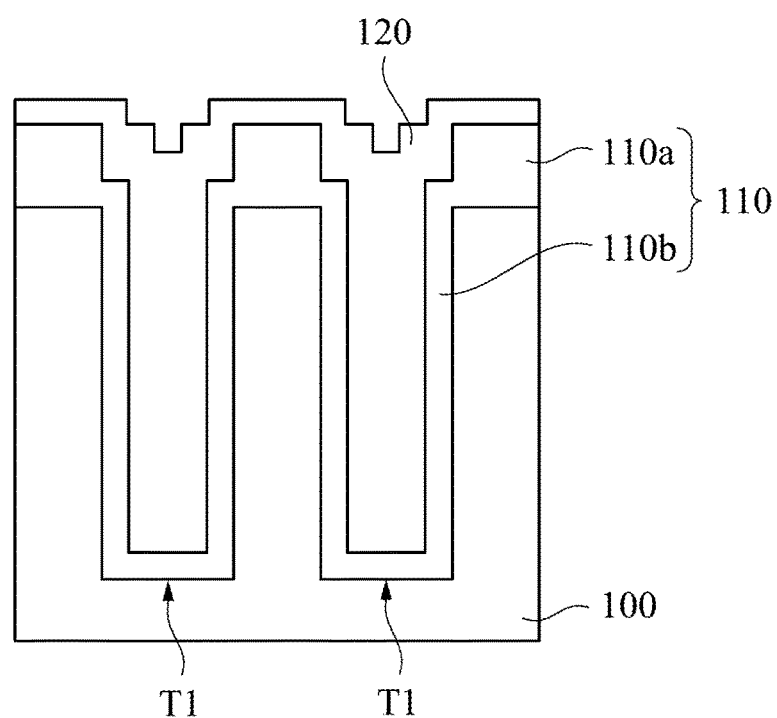

Reference is made to FIG. 1 and FIG. 4. In the operation 14 of FIG. 1, the substrate 100 is processed with a treating solution 120, in which the treating solution 120 includes liquid carbon dioxide and an additive. Specifically, the treating solution 120 is supplied from the treating solution source 220 to the processing chamber 212 (shown in FIG. 2) to process the substrate 100. In some embodiments, processing the substrate 100 includes flowing the treating solution 120 over the substrate 100. As shown in FIG. 4, the treating solution 120 is filled in the trench T1 and covers the oxide layer 110.

In some embodiments, preparing the treating solution 120 includes following steps. First, gaseous $C_xH_{2x+2}$ and oxygen are provided in a chamber to form gaseous carbon dioxide and water vapor, in which x is 1-4. The reaction may be formulated as follow:

$$C_xH_{2x+2}+O_2 \rightarrow CO_2+H_2O \qquad \text{reaction formula (1)}$$

The gaseous carbon dioxide and water vapor are then mixed with the additive. In some embodiments, the additive includes HF, HCl, or $H_2O_2$. In some examples, the gaseous carbon dioxide and the water vapor are mixed with gaseous HF, gaseous HCl, or gaseous $H_2O_2$. The carbon dioxide is then transformed from gaseous state to liquid state, thereby forming the treating solution 120. In some embodiments, the carbon dioxide and the water vapor are transformed from gaseous state to liquid state by elevating pressure of the chamber. A portion of the carbon dioxide may be slightly dissolved in the water to form carbonic acid, such that the treating solution 120 can prevent the substrate 100 from electrostatic damage when processing the substrate 100.

In the following description, take the treating solution 120 including HF as example to process the substrate 100. In some embodiments, the additive is HF having a concentration of about 0.01%-1% in the treating solution 120. For example, the concentration of HF may be 0.05%, 0.1%, 0.2%, 0.3%, 0.4%, 0.5%, 0.6%, 0.7%, 0.8% or 0.9%. The treating solution 120 including HF may react with the oxide layer 110, and the reaction may be formulated as follow:

$$SiO_2+HF \rightarrow SiF_4+H_2O \qquad \text{reaction formula (2)}$$

Figure 5:
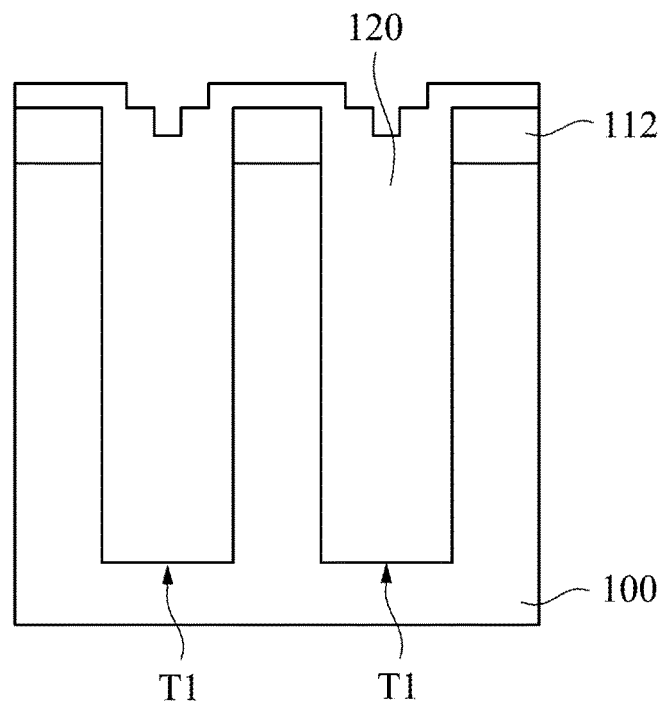

By processing the substrate 100 with the treating solution 120 including HF, some impurities on the substrate 100 may be removed. As shown in FIG. 5, after processing the substrate 100 with the treating solution 120, a portion of the oxide layer 110 is removed. Specifically, the second portion 110b of the oxide layer 110 and a top of the first portion 110a of the oxide layer 110 are removed by the treating solution 120.

Figure 6:
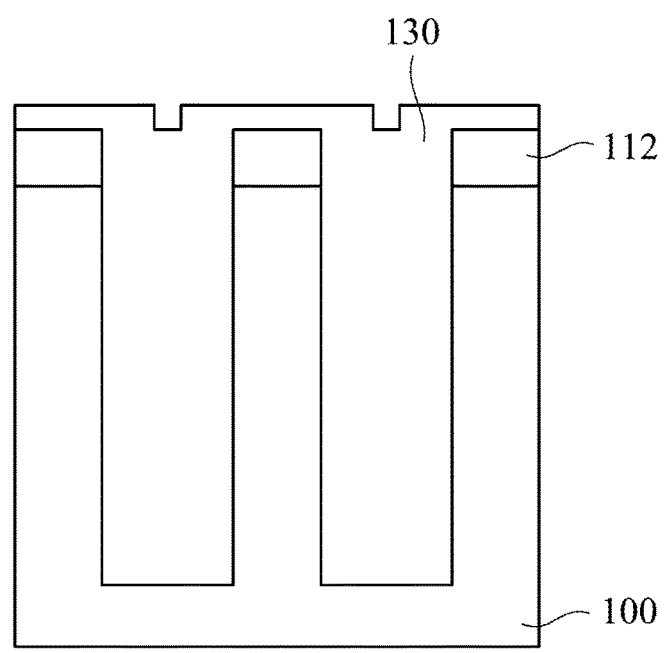

Reference is made to FIG. 1 and FIG. 6. In the operation 16 of FIG. 1, the treating solution 120 is displaced by a supercritical fluid carbon dioxide 130. As shown in FIG. 6, the supercritical fluid carbon dioxide 130 is filled in the trench T1. The supercritical fluid carbon dioxide 130 may remove any remaining liquids or particles that may be present in the trench T1. In some embodiments, the treating solution 120 (shown in FIG. 5) is directly displaced by an additional supercritical fluid carbon dioxide 130. Specifically, the additional supercritical fluid carbon dioxide 130 is supplied from the fluid source 230 (shown in FIG. 2) to the processing chamber 212 to displace the treating solution 120 in the processing chamber 212. The additional supercritical fluid carbon dioxide 130 may be mixed with the treating solution 120 in the processing chamber 212, and the mixing solution may be drained from the processing chamber 212 by the exhaust unit 240 (shown in FIG. 2). The above displacing process may be repeated multiple times to ensure that treating solution 120 is removed from the processing chamber 212.

In other embodiments, displacing the treating solution 120 by the supercritical fluid carbon dioxide 130 includes following steps. The treating solution 120 may be firstly displaced by an additional liquid carbon dioxide (not shown). Specifically, the additional liquid carbon dioxide may be supplied from the fluid source 230 (shown in FIG. 2) to the processing chamber 212 to displace the treating solution 120 in the processing chamber 212. The additional liquid carbon dioxide may be mixed with the treating solution 120 in the processing chamber 212, and both of the additional liquid carbon dioxide and the treating solution 120 are drained from the processing chamber 212 by the exhaust unit 240 (shown in FIG. 2). The above displacing process may be repeated multiple times to ensure that treating solution 120 is removed from the processing chamber 212. After the treating solution 120 is removed, the additional liquid carbon dioxide in the processing chamber 212 is then transformed to supercritical fluid carbon dioxide 130. In some embodiments, the liquid carbon dioxide is transformed to supercritical fluid carbon dioxide 130 by degrading a temperature of the processing chamber 212.

In some embodiments, the treating solution 120 drained from the processing chamber 212 may be collected and be recycled by a recycle unit 250 of the processing apparatus 200. The carbon dioxide and the additive in the treating solution 120 may be separated by controlling a temperature and/or a pressure of the recycle unit 250. The separated carbon dioxide and the additives may be reused for processing the semiconductor device.

Figure 7:
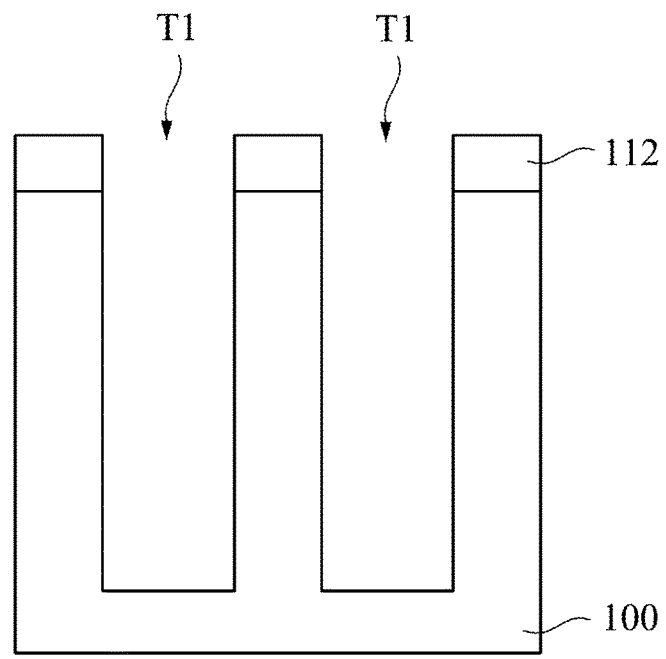

Reference is made to FIG. 1 and FIG. 7. In the operation 18 of FIG. 1, the substrate 100 is dried by transforming the supercritical fluid carbon dioxide 130 to gaseous carbon dioxide. In some embodiments, the substrate 100 is dried by isothermally depressurizing the processing chamber 212. Specifically, the supercritical fluid carbon dioxide 130 is transformed from super critical fluid state to gaseous state, and the gaseous carbon dioxide is then removed from the processing chamber 212 by the exhaust unit 240 (shown in FIG. 2). The supercritical fluid carbon dioxide 130 has no surface tension, such that its surface tension is similar to gas. During phase transition of carbon dioxide, due to its properties (e.g., the supercritical fluid carbon dioxide 130 has no surface tension), capillary forces between the protruding portions 102 of the substrate 100 may be eliminated. Therefore, the supercritical fluid carbon dioxide 130 drying may prevent deformation of the semiconductor devices during the drying process.

It is noted that processing the substrate 100 and drying the substrate 100 is performed in the same processing chamber 212. Therefore, the number of the chamber for processing the semiconductor device can be decreased. Further, the processing process is more efficiency due to there is no need to transfer the semiconductor device between chambers during cleaning and drying process. In some embodiments, the method 10 further includes recycling the gaseous carbon dioxide removed from the processing chamber 212. The gaseous carbon dioxide may be reused for processing the semiconductor device.

Figure 8:
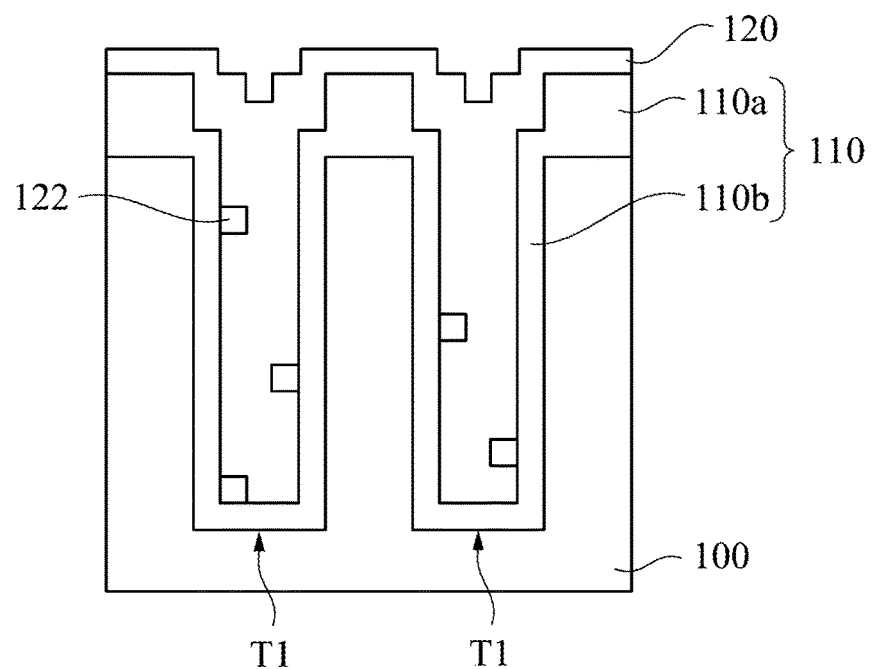

Other treating solution 120 may be used in the operation 14 for processing the substrate 100. Reference is made to FIG. 8. In some embodiments, the substrate 100 is processed with a treating solution 120 including liquid carbon dioxide and HCl. In some embodiments, the additive HCl has a concentration of about 0.01%-0.1% in the treating solution 120. For example, the concentration of HCl may be 0.05%, 0.1%, 0.2%, 0.3%, 0.4%, 0.5%, 0.6%, 0.7%, 0.8% or 0.9%. As shown in FIG. 8, the treating solution 120 including HCl is filled in the trench T1. The treating solution 120 including HCl may react with impurities 122. In some embodiments, the impurities 122 include metal ions which may be resulted from the process of forming the trench T1 in the substrate 100 and the oxide layer 110 on the substrate 100. For example, the metal ions may come from deposition apparatus, metal chamber, or other cleaning solution for cleaning the substrate 100. The reaction may be formulated as follow:

$$M + HCl \rightarrow MCl + H_2 \qquad \text{reaction formula (3)}$$

Figure 9:
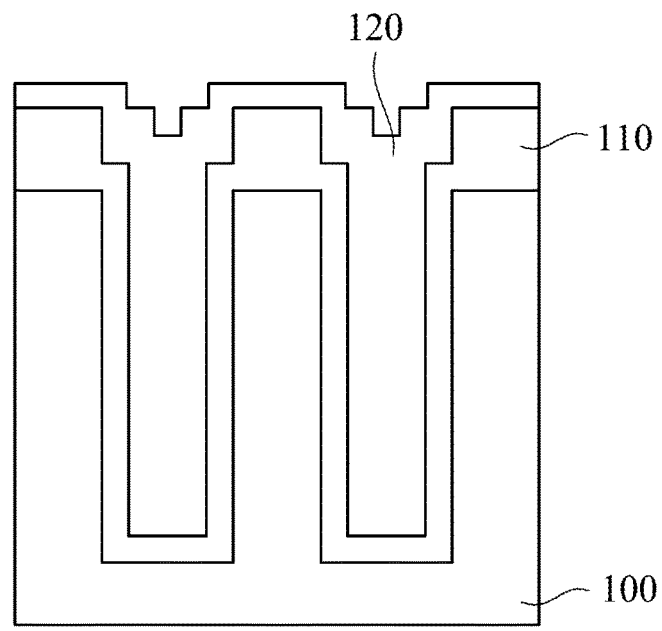

In reaction formula (3), M represents metal ion. As shown in FIG. 9, after processing the substrate 100 with the treating solution 120, the impurities 122 are removed.

Figure 10:
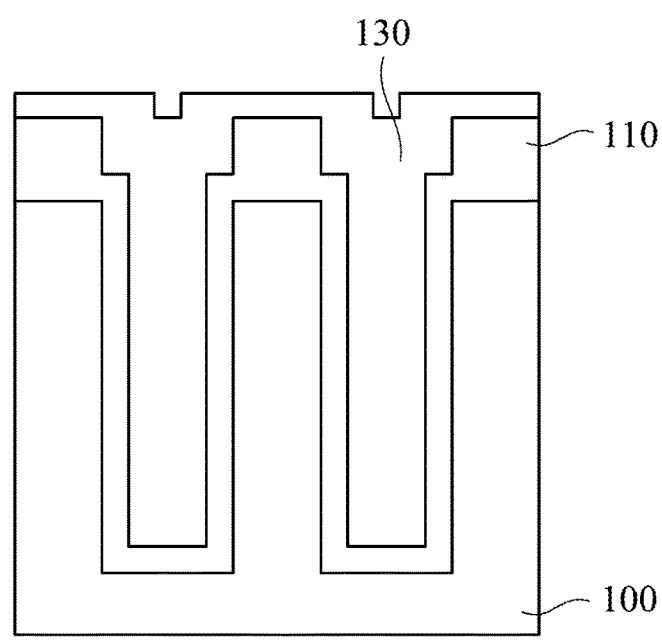

Reference is made to FIG. 10. The treating solution 120 having HCl is displaced by a supercritical fluid carbon dioxide 130. The displacing process of the treating solution 120 having HCl may be the same as that of the treating solution 120 having HF described above, and will not be repeated hereinafter.

Figure 11:
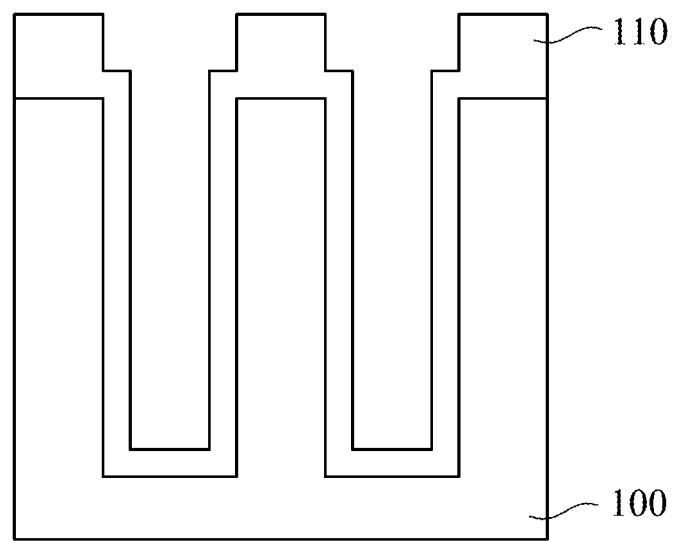

Reference is made to FIG. 11. The substrate 100 is dried by transforming the supercritical fluid carbon dioxide 130 to gaseous carbon dioxide. The drying process of the treating solution 120 having HCl may be the same as that of the treating solution 120 having HF described above, and will not be repeated hereinafter. After transforming the supercritical fluid carbon dioxide 130 to gaseous carbon dioxide, the gaseous carbon dioxide may be removed from the processing chamber 212 and be recycled.

Figure 12:
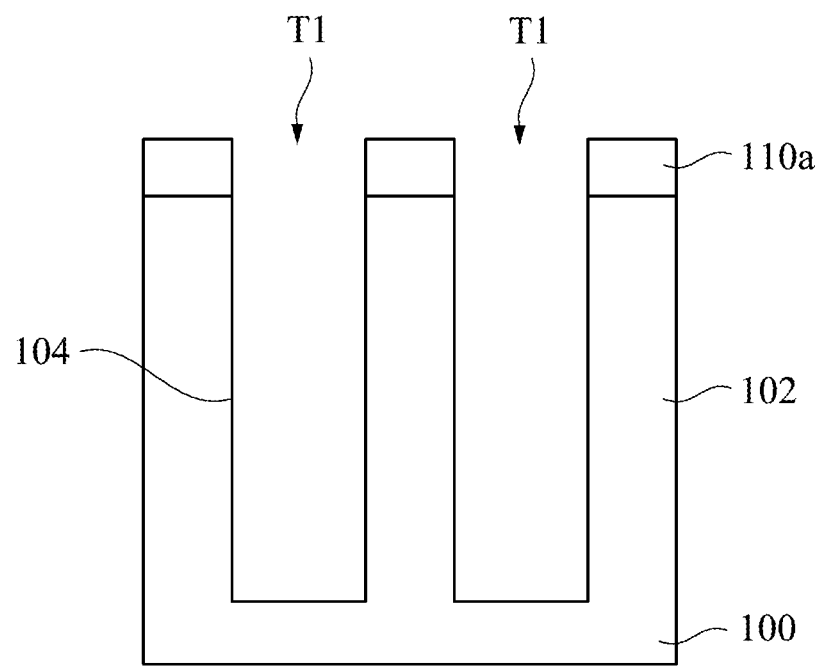
Figure 13:
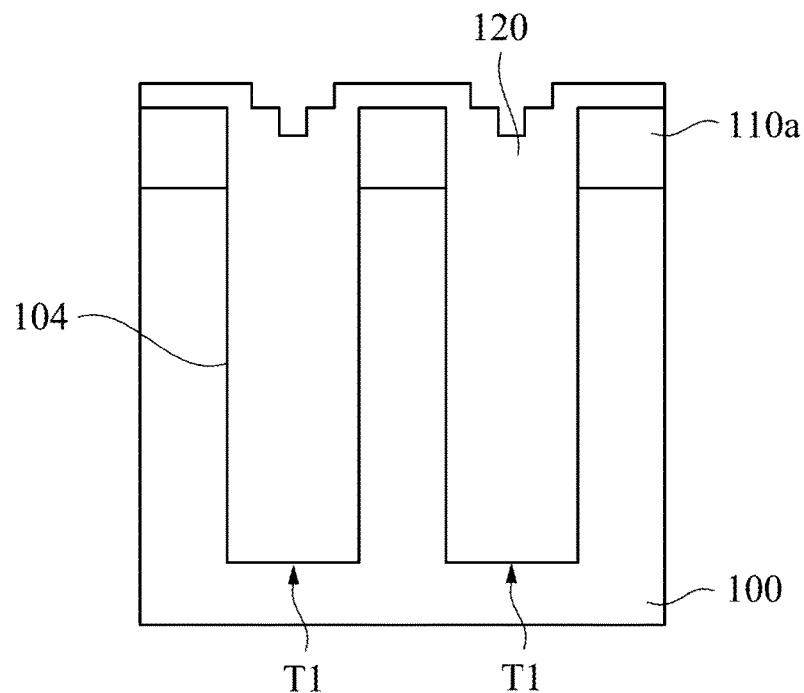

Reference is made to FIG. 12 and FIG. 13. In some embodiments, a treating solution 120 including carbon dioxide and $H_2O_2$ may be used in the method 10 for processing the substrate 100 shown in FIG. 12. The substrate 100 is similar to the substrate 100 shown in FIG. 3, except the substrate 100 shown in FIG. 12 has no oxide layer 110 on the inner surface 104. The substrate 100 may include a plurality of trench T1 and protruding portions 102. An oxide layer 110a may be disposed on the protruding portions 102.

As shown in FIG. 13. The treating solution 120 including $H_2O_2$ is filled in the trench T1 to process the substrate 100. In some embodiments, the additive $H_2O_2$ has a concentration of about 0.1%-3% in the treating solution 120. For example, the concentration of $H_2O_2$ may be 0.2%, 0.5%, 1%, 1.5%, 2%, 2.5%, or 2.9%. The treating solution 120 may react with the inner surface 104 of the substrate 100. The reaction may be formulated as follow:

$$Si+H_2O_2 \rightarrow SiO_2+H_2 \qquad \text{reaction formula (4)}$$

Figure 14:
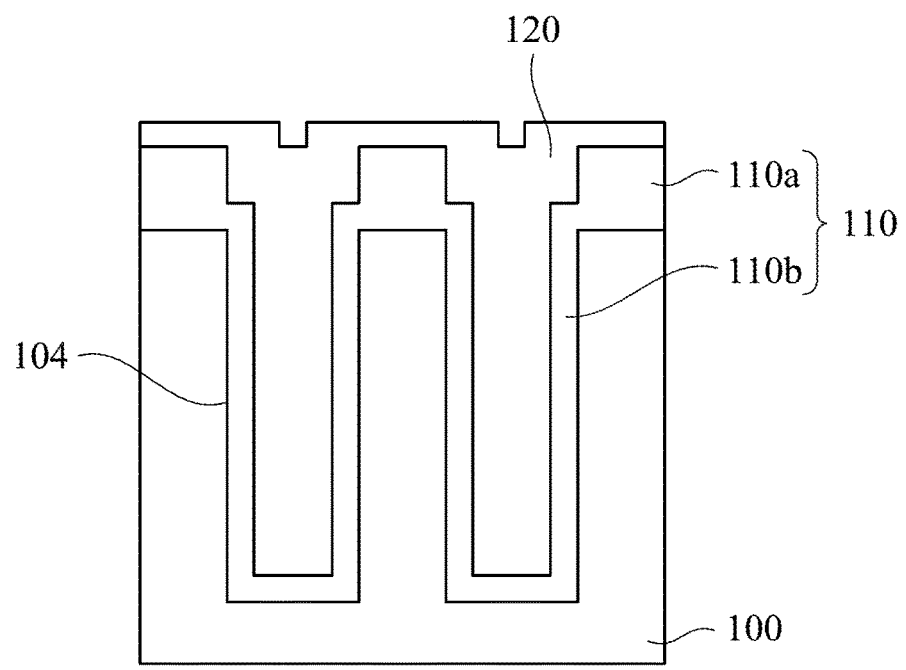

Reference is made to FIG. 14. After processing the substrate 100 with the treating solution 120, the inner surface 104 of the substrate 100 is oxidized to form an oxide layer 110b thereon. Since the oxide layer 110 covers the substrate 100, the substrate 100 may have a hydrophobic surface. Therefore, a water mark defect issue can be prevented and/or reduced.

Figure 15:
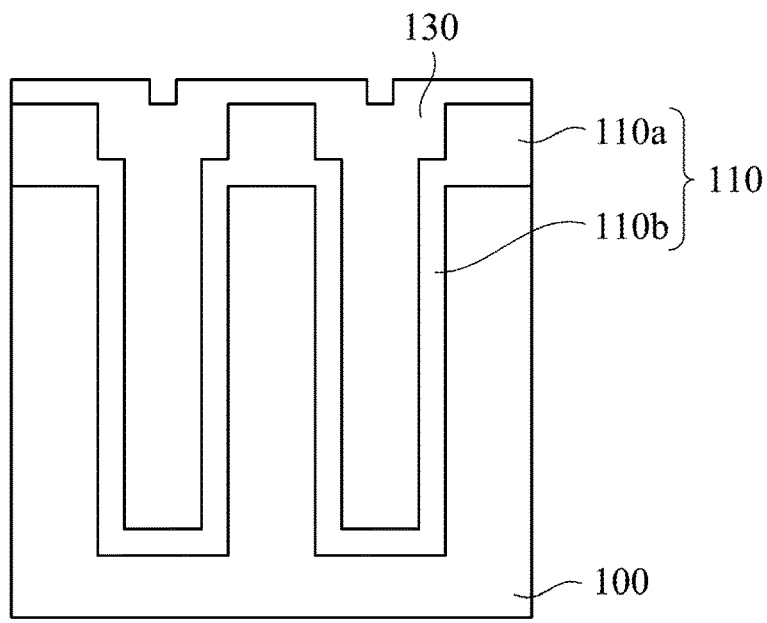

Reference is made to FIG. 15. The treating solution 120 including $H_2O_2$ is displaced by a supercritical fluid carbon dioxide 130. The displacing process of the treating solution 120 including $H_2O_2$ may be same as that of the treating solution 120 having HF described above, and will not be repeated hereinafter.

Figure 16:
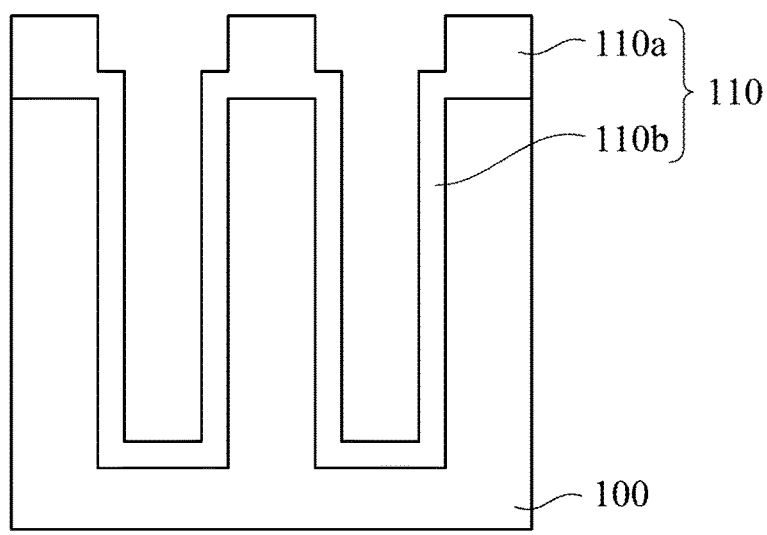

Reference is made to FIG. 16. The substrate 100 is dried by transforming the supercritical fluid carbon dioxide 130 to gaseous carbon dioxide. The drying process of the treating solution 120 having $H_2O_2$ may be the same as that of the treating solution 120 having HF described above, and will not be repeated hereinafter. After transforming the supercritical fluid carbon dioxide 130 to gaseous carbon dioxide, the gaseous carbon dioxide may be removed from the processing chamber 212 and be recycled.

Figure 17:
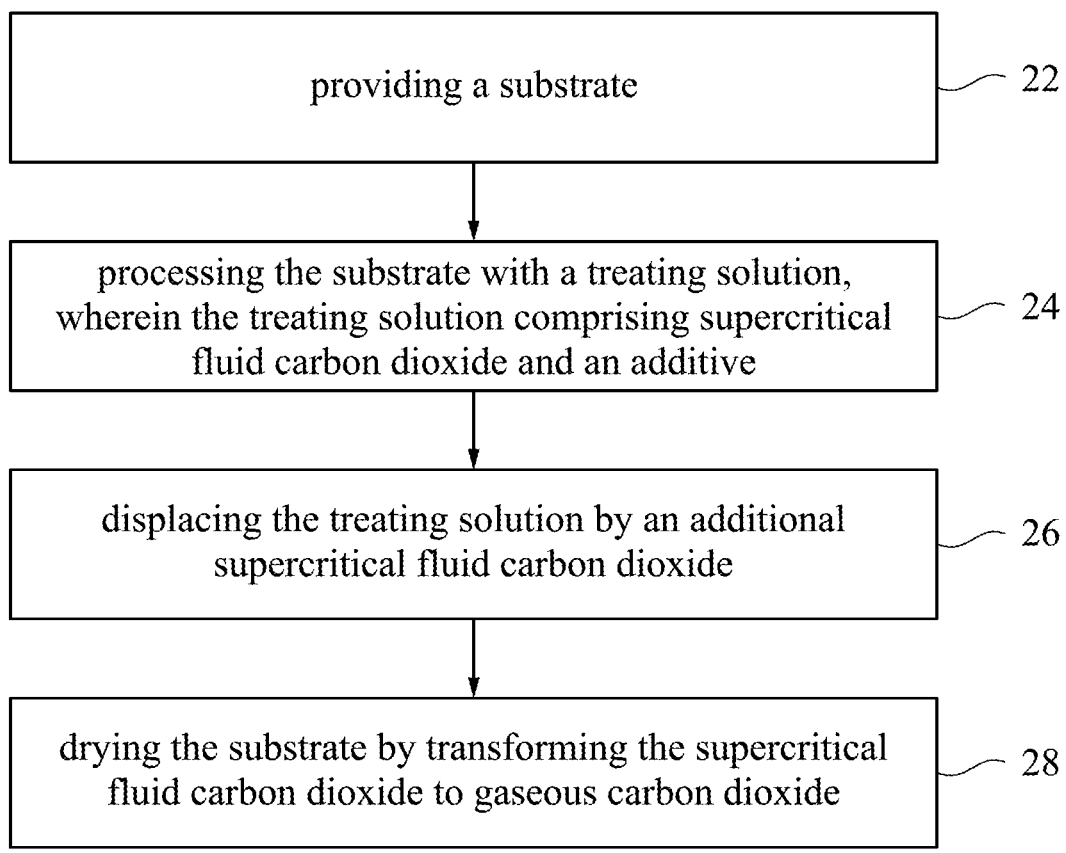
FIG. 17 is a flow chart illustrating a method of processing a semiconductor device in accordance with some embodiments of this disclosure.

Reference is made to FIG. 17. FIG. 17 is a flow chart illustrating another method of manufacturing a semiconductor device in accordance with some embodiments of this disclosure. As shown in FIG. 17, the method 20 includes operation 22, operation 24, operation 26 and operation 28. It is noted that the method depicted in FIG. 17 is merely an example, and is not intended to limit the present invention. Accordingly, additional operations may be performed before, during, and/or after the method depicted in FIG. 17, and some other operations may only be briefly described herein. FIG. 18 to FIG. 21 are cross-sectional views at various stages of method 20 according to some embodiments of the present disclosure.

Figure 18:
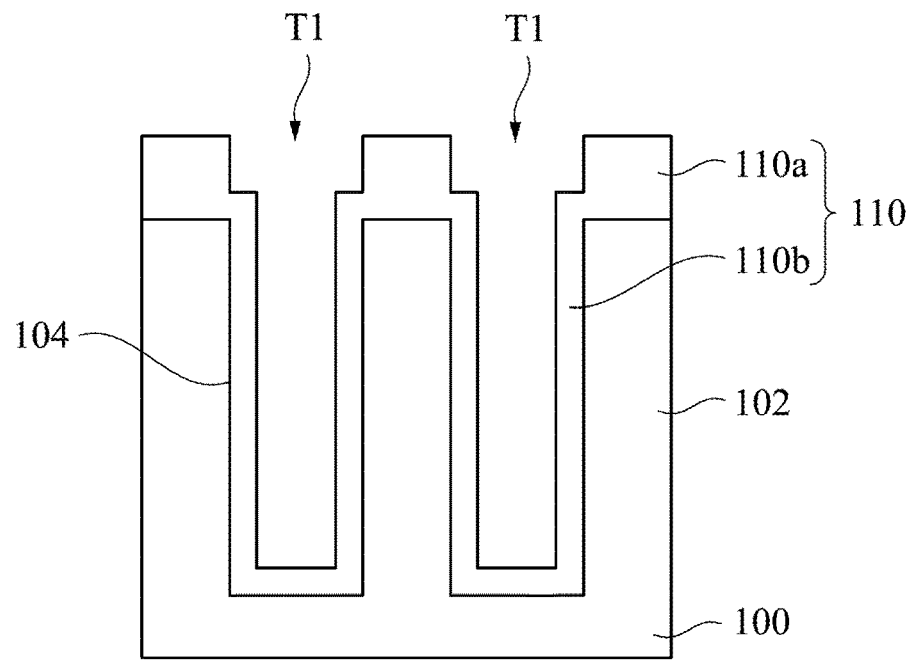
FIG. 18 to FIG. 21 are cross-sectional views of various intermediary stages in the processing of semiconductor device in accordance with some embodiments of this disclosure.

Reference is made to FIG. 17 and FIG. 18. In the operation 22 of FIG. 17, a substrate 100 is provided. The substrate 100 may be placed in a processing apparatus 200 shown in FIG. 2. As shown in FIG. 18, the substrate 100 may have a plurality of trench T1 and a plurality of protruding portions 102 separated by the trenches T1. An oxide layer 110 may be formed on the substrate 100. Specifically, the oxide layer 110 may include a first portion 110a on the protruding portions 102 of the substrate 100 and a second portion 110b on an inner surface 104 of the substrate 100. In some embodiments, the substrate 110 may be, for example, a silicon substrate, a gallium arsenide substrate, a silicon germanium substrate, or the like. In some embodiments of the present invention, the substrate 110 may be a silicon substrate on insulator (SOI) substrate. In some embodiments, the substrate 110 may further include at least one shallow trench isolation (STI) region formed therein. In one example, the shallow trench isolation (STI) region may include silicon oxide, silicon nitride and/or silicon oxynitride. In some embodiments, the oxide layer 110 includes silicon oxide, but is not limited thereto.

Figure 19:
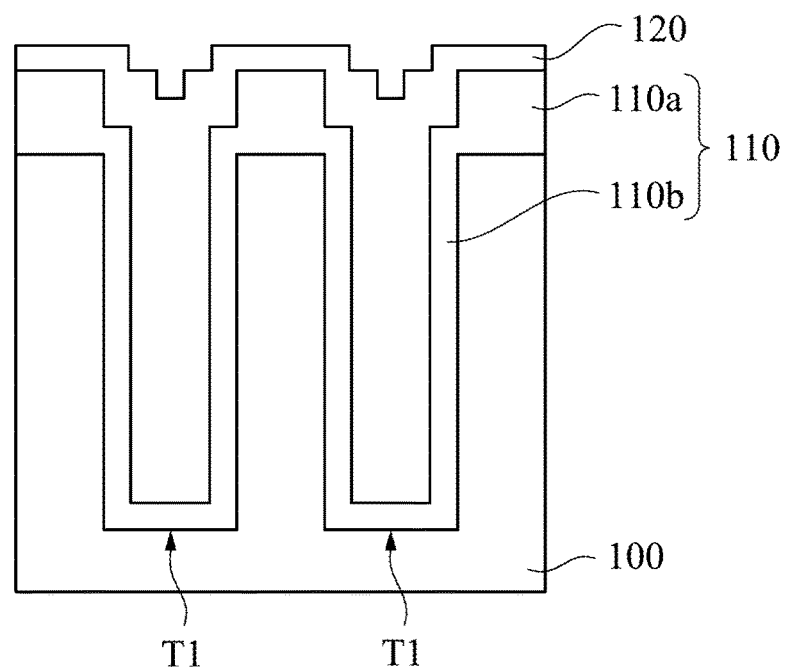

Reference is made to FIG. 17 and FIG. 19. In the operation 24 of FIG. 17, the substrate 100 is processed with a treating solution 120, in which the treating solution 120 includes supercritical fluid carbon dioxide 130 and an additive treating. Specifically, the treating solution 120 is supplied from the treating solution source 220 to the processing chamber 212 (shown in FIG. 2) to process the substrate 100.

In some embodiments, processing the substrate 100 includes flowing the treating solution 120 over the substrate 100. As shown in FIG. 19, the treating solution 120 is filled in the trench T1 and covers the oxide layer 110.

In some embodiments, preparing the treating solution 120 includes following steps. First, gaseous $C_xH_{2x+2}$ and oxygen are provided in a chamber to form gaseous carbon dioxide and water vapor, in which x is 1-4. The gaseous carbon dioxide is then transformed to supercritical fluid carbon dioxide 130. In some embodiments, the carbon dioxide is transformed from gaseous state to supercritical fluid state by elevating a pressure of the chamber. In addition, the water vapor is transformed to liquid state during transforming the gaseous carbon dioxide. The supercritical fluid carbon dioxide is then mixed with the additive to form the treating solution 120. In some embodiments, the additive includes dilute HF (DHF) solution, HCl solution, $H_2O_2$ solution, or hydrophobic agent.

In the following description, take the treating solution 120 including hydrophobic agent as example to process the substrate 100. In some embodiments, the hydrophobic agent includes organic fluorine compound or organic silicon compound. The hydrophobic agent may include C—F group and/or C—Si—H group. After processing the substrate 100 with the treating solution 120 including hydrophobic agent, a hydrophobic property of the treated surface of the substrate 100 may be increased.

Figure 20:
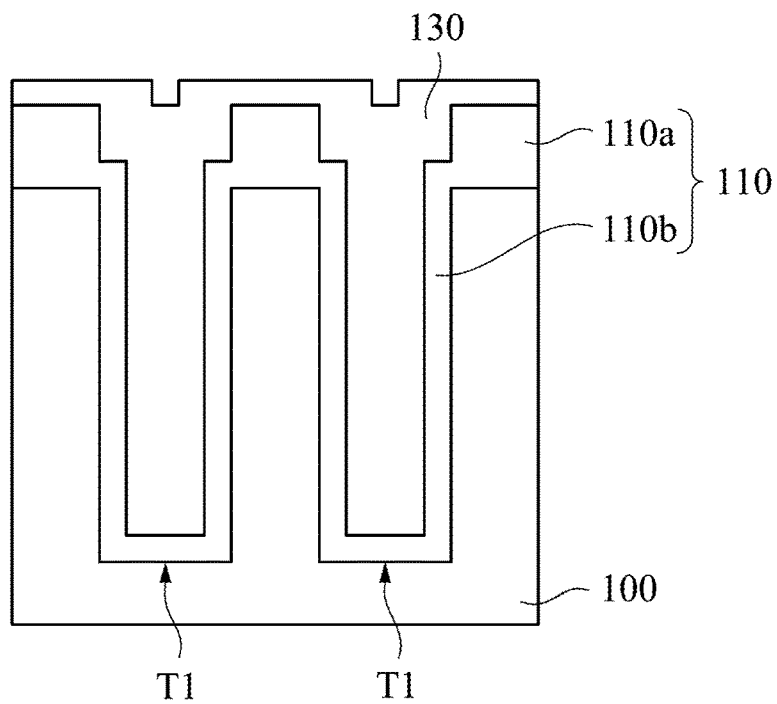

Reference is made to FIG. 17 and FIG. 20. In the operation 26 of FIG. 17, the treating solution 120 is displaced by an additional supercritical fluid carbon dioxide 130. As shown in FIG. 20, the supercritical fluid carbon dioxide 130 is filled in the trench T1. The supercritical fluid carbon dioxide 130 may remove any remaining liquids or particles that may be present in the trench T1. In some embodiments, an additional supercritical fluid carbon dioxide 130 is supplied from the fluid source 230 (shown in FIG. 2) to the processing chamber 212 to displace the treating solution 120 (shown in FIG. 5) in the processing chamber 212. The additional supercritical fluid carbon dioxide 130 may be mixed with the treating solution 120, and the mixing solution may be drained from the processing chamber 212 by the exhaust unit 240 (shown in FIG. 2). The above displacing process may be repeated multiple times to ensure that treating solution 120 is removed from the processing chamber 212.

In some embodiments, the treating solution 120 drained from the processing chamber 212 may be collected and be recycled by a recycle unit 250 of the processing apparatus 200. The carbon dioxide and the additive in the treating solution 120 may be separated by controlling a temperature and/or a pressure of the recycle unit 250. The separated carbon dioxide and the additives may be reused for processing the semiconductor device.

Figure 21:
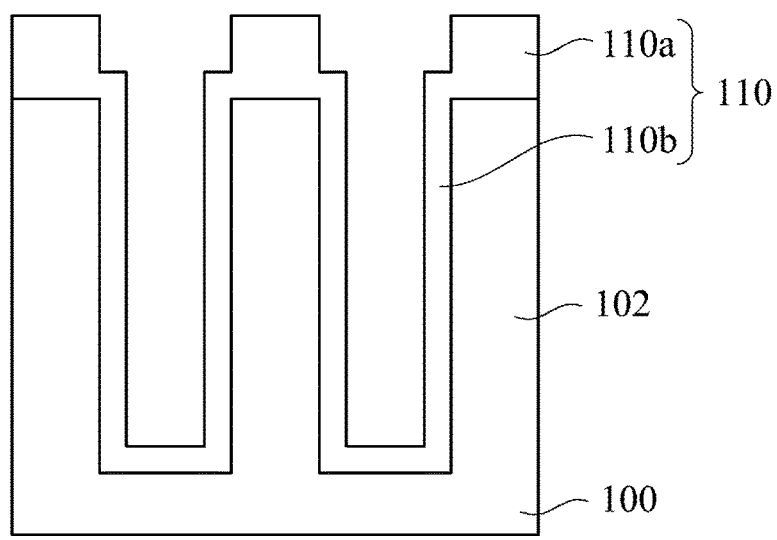

Reference is made to FIG. 17 and FIG. 21. In the operation 28 of FIG. 17, the substrate 100 is dried by transforming the supercritical fluid carbon dioxide 130 to gaseous carbon dioxide. In some embodiments, the substrate 100 is dried by isothermally depressurizing the processing chamber 212. Specifically, the supercritical fluid carbon dioxide 130 is transformed from super critical fluid state to gaseous state, and the gaseous carbon dioxide is then removed from the processing chamber 212 by the exhaust unit 240 (shown in FIG. 2). The supercritical fluid carbon dioxide 130 may remove any remaining liquids or particles that may be present in the trench T1. During phase transition of carbon dioxide, due to its properties (e.g., the supercritical fluid carbon dioxide 130 has no surface tension), capillary forces between the protruding portions 102 of the substrate 100 may be eliminated. Therefore, the supercritical fluid carbon dioxide 130 drying may prevent deformation of the semiconductor devices during the drying process.

It is noted that processing the substrate 100 and drying the substrate 100 may be performed in the same processing chamber 212. Therefore, the number of the chamber for processing the semiconductor device can be decreased. Further, the processing process is more efficiency due to there is no need to transfer the semiconductor device between chambers during cleaning and drying process. In some embodiments, the method 20 further includes recycling the gaseous carbon dioxide removed from the processing chamber 212. The gaseous carbon dioxide may be reused for processing the semiconductor device.

In some embodiments, other treating solution 120 may be used in the operation 24 for processing the substrate 100. For example, the treating solution 120 includes supercritical fluid carbon dioxide and dilute HF (DHF) solution as additive. In some embodiments, the dilute HF solution has a concentration of about 0.01%-1% in the treating solution 120. For example, the concentration of HF may be 0.05%, 0.1%, 0.2%, 0.3%, 0.4%, 0.5%, 0.6%, 0.7%, 0.8% or 0.9%. The result of processing the substrate 100 with the treating solution 120 including supercritical fluid carbon dioxide and dilute HF (DHF) solution may be similar to that of the treating solution 120 including liquid carbon dioxide and HF described in method 10. Therefore, the cross-sectional views at various stages of processing the substrate 100 with treating solution 120 including supercritical fluid carbon dioxide and dilute HF (DHF) solution can be referred to FIG. 2 to FIG. 7. After processing the substrate 100 with the treating solution 120, some oxide impurities on the substrate 100 may be removed.

In other embodiments, the treating solution 120 includes supercritical fluid carbon dioxide and HCl solution is used in the operation 24. In some embodiments, the HCl solution has a concentration of about 0.01%-0.1% in the treating solution 120. For example, the concentration of HCl solution may be 0.05%, 0.1%, 0.2%, 0.3%, 0.4%, 0.5%, 0.6%, 0.7%, 0.8% or 0.9%. The result of processing the substrate 100 with the treating solution 120 including supercritical fluid carbon dioxide and HCl solution may be similar to that of the treating solution 120 including liquid carbon dioxide and HCl described in method 10. Therefore, the cross-sectional views at various stages of processing the substrate 100 with treating solution 120 including supercritical fluid carbon dioxide and HCl solution can be referred to FIG. 8 to FIG. 11. After processing the substrate 100 with the treating solution 120, some impurities such as metal ion can be removed.

In yet other embodiments, the treating solution 120 includes supercritical fluid carbon dioxide and $H_2O_2$ solution is used in the operation 24. In some embodiments, the $H_2O_2$ solution has a concentration of about 0.1%-3% in the treating solution 120. For example, the concentration of $H_2O_2$ may be 0.2%, 0.5%, 1%, 1.5%, 2%, 2.5%, or 2.9%. The result of processing the substrate 100 with the treating solution 120 including supercritical fluid carbon dioxide and $H_2O_2$ solution may be similar to that of the treating solution 120 including liquid carbon dioxide and $H_2O_2$ described in method 10. Therefore, the cross-sectional views at various stages of processing the substrate 100 with treating solution 120 including supercritical fluid carbon dioxide and $H_2O_2$ solution can be referred to FIG. 12 to FIG. 16. After processing the substrate 100 (shown in FIG. 12) with the treating solution 120, the inner surface 104 of the substrate 100 is oxidized to form an oxide layer 110b thereon. Since the oxide layer 110 covers the substrate 100, the substrate 100 may have a hydrophobic surface. Therefore, a water mark defect issue can be prevented and/or reduced.

As described above, according to the embodiments of the present disclosure, a method of processing a semiconductor device is provided. A substrate of semiconductor device is cleaned with a treating solution including carbon dioxide (gaseous state or supercritical fluid state) and additive. After cleaning the substrate, the treating solution is displaced with a supercritical fluid carbon dioxide and dried. Because the supercritical fluid carbon dioxide has no surface tension, capillary forces between patterns of the substrate may be eliminated. Therefore, deformation issue of the semiconductor devices during the drying process can be prevented. The carbon dioxide (gaseous state and/or supercritical fluid state) and additive used in this method can be recycled and reused. In addition, the cleaning and drying process can be performed in a same processing chamber, such that the processing process is more efficiency.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of processing a semiconductor device including a substrate, comprising:
   providing a substrate;
   processing the substrate with a treating solution, comprising:
      providing gaseous $C_xH_{2x+2}$ and oxygen to form gaseous carbon dioxide and water vapor, wherein x is 1-4;
      mixing an additive with the gaseous carbon dioxide and water vapor; and
      transforming the gaseous carbon dioxide from a gaseous state to a liquid state to form the treating solution, wherein the treating solution comprises liquid carbon dioxide and the additive;
   displacing the treating solution by a supercritical fluid carbon dioxide; and
   drying the substrate by transforming the supercritical fluid carbon dioxide to gaseous carbon dioxide.

2. The method of claim 1, wherein the additive comprises HF, HCl, or $H_2O_2$.

3. The method of claim 1, wherein processing the substrate comprises flowing the treating solution over the substrate.

4. The method of claim 1, wherein processing the substrate and drying the substrate are performed in a same chamber.

5. The method of claim 1, wherein displacing the treating solution by the supercritical fluid carbon dioxide comprises:
   displacing the treating solution by an additional liquid carbon dioxide; and
   transforming the additional liquid carbon dioxide to supercritical fluid carbon dioxide.

6. The method of claim 1, further comprising recycling the gaseous carbon dioxide.

7. The method of claim 2, wherein the additive is HF having a concentration of about 0.01%-1% in the treating solution.

8. The method of claim 2, wherein the additive is HCl having a concentration of about 0.01%-0.1% in the treating solution.

9. The method of claim 2, wherein the additive is $H_2O_2$ having a concentration of about 0.1%-3% in the treating solution.

10. A method of processing a semiconductor device including a substrate, comprising:
    providing a substrate;
    processing the substrate with a treating solution, comprising:
        providing gaseous $C_xH_{2x+2}$ and oxygen to form gaseous carbon dioxide and water vapor, wherein x is 1-4;
        mixing an additive with the gaseous carbon dioxide and water vapor; and
        transforming the gaseous carbon dioxide to supercritical fluid carbon dioxide; and
        mixing the additive with the supercritical fluid carbon dioxide to form the treating solution;
    displacing the treating solution by an additional supercritical fluid carbon dioxide; and
    drying the substrate by transforming the supercritical fluid carbon dioxide to gaseous carbon dioxide.

11. The method of claim 10, wherein the additive comprises dilute HF (DHF) solution, HCl solution, $H_2O_2$ solution, or a hydrophobic agent.

12. The method of claim 10, wherein processing the substrate comprises flowing the treating solution over the substrate.

13. The method of claim 10, wherein processing the substrate and drying the substrate are performed in a same chamber.

14. The method of claim 10, further comprising recycling the gaseous carbon dioxide.

15. The method of claim 11, wherein the additive is dilute HF (DHF) solution having a concentration of about 0.01%-1% in the treating solution.

16. The method of claim 11, wherein the additive is HCl solution having a concentration of about 0.01%-0.1% in the treating solution.

17. The method of claim 11, wherein the additive is $H_2O_2$ solution having a concentration of about 0.1%-3% in the treating solution.

18. The method of claim 11, wherein the hydrophobic agent comprises an organic fluorine compound or an organic silicon compound.

* * * * *